US011054461B1

(12) United States Patent
Chong et al.

(10) Patent No.: US 11,054,461 B1
(45) Date of Patent: Jul. 6, 2021

(54) TEST CIRCUITS FOR TESTING A DIE STACK

(71) Applicant: Xilinx, Inc., San Jose, CA (US)

(72) Inventors: Nui Chong, San Jose, CA (US); Amitava Majumdar, San Jose, CA (US); Cheang-Whang Chang, Mountain View, CA (US); Henley Liu, San Jose, CA (US); Myongseob Kim, Pleasanton, CA (US); Albert Shih-Huai Lin, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 59 days.

(21) Appl. No.: 16/351,310

(22) Filed: Mar. 12, 2019

(51) Int. Cl.
  *G01R 31/28* (2006.01)
  *G01R 31/3185* (2006.01)
  *G01R 31/3177* (2006.01)
  *H01L 25/065* (2006.01)

(52) U.S. Cl.
  CPC ..... *G01R 31/2851* (2013.01); *G01R 31/3177* (2013.01); *G01R 31/318513* (2013.01); *H01L 25/0657* (2013.01)

(58) Field of Classification Search
  CPC ............ G01R 31/2884; G01R 31/2851; G01R 31/31717; G01R 31/318513; H01L 25/0657; H01L 23/481
  See application file for complete search history.

(56) References Cited

U.S. PATENT DOCUMENTS

| | | | |
|---|---|---|---|
| 7,518,398 B1* | 4/2009 | Rahman | H03K 19/17796 326/38 |
| 7,727,896 B1* | 6/2010 | Rahman | H01L 23/481 438/700 |
| 8,415,783 B1* | 4/2013 | Rahman | H01L 25/0657 257/686 |
| 9,058,454 B1* | 6/2015 | Young | G06F 30/30 |
| 9,389,945 B1* | 7/2016 | Press | G01R 31/318371 |
| 9,423,454 B2* | 8/2016 | Kim | G01R 31/31703 |
| 9,689,918 B1* | 6/2017 | Cheng | G01R 31/318513 |
| 2008/0197872 A1* | 8/2008 | Matsushima | G01R 31/2853 324/762.02 |

(Continued)

OTHER PUBLICATIONS

Pooja et al., Three-Dimensional Wafer Stacking Using Cu TSV Integrated with 45 nm High Performance SOI-CMOS Embedded DRAM Technology (Year: 2014).*

(Continued)

*Primary Examiner* — Patrick Assouad
*Assistant Examiner* — Demetrius R Pretlow
(74) *Attorney, Agent, or Firm* — Patterson + Sheridan, LLP

(57) ABSTRACT

Device(s) and method(s) related generally to a wafer or die stack are disclosed. In one such device, a die stack of two or more integrated circuit dies has associated therewith test circuits corresponding to each level of the die stack each with a set of pads. A test data-input path includes being from: a test data-in pad through a test circuit to a test data-out pad of each of the test circuits; and the test data-out pad to the test data-in pad between consecutive levels of the test circuits. Each of the set of pads includes the test data-in pad and the test data-out pad respectively thereof. A test data-output path is coupled to the test data-out pad of a level of the levels.

18 Claims, 12 Drawing Sheets

(56) References Cited

U.S. PATENT DOCUMENTS

| | | | | |
|---|---|---|---|---|
| 2009/0121736 A1* | 5/2009 | Jenkins | H01L 22/20 | 324/754.23 |
| 2010/0332177 A1* | 12/2010 | Wu | G11C 29/32 | 702/117 |
| 2011/0012633 A1* | 1/2011 | Rahman | G01R 31/318544 | 324/754.07 |
| 2012/0319717 A1* | 12/2012 | Chi | G01R 31/31717 | 324/756.05 |
| 2013/0120021 A1* | 5/2013 | Chi | H03K 19/1737 | 326/37 |
| 2013/0162282 A1* | 6/2013 | Hatakeyama | H01L 25/18 | 324/762.01 |
| 2013/0185608 A1* | 7/2013 | Bhawmik | G01R 31/318513 | 714/727 |
| 2013/0197851 A1* | 8/2013 | Bhawmik | G01R 31/318513 | 702/118 |
| 2013/0326294 A1* | 12/2013 | Lo | G11C 29/16 | 714/718 |
| 2014/0110711 A1* | 4/2014 | Gorman | G01R 31/318513 | 257/48 |
| 2014/0189456 A1* | 7/2014 | Loh | G01R 31/2812 | 714/733 |
| 2014/0210496 A1* | 7/2014 | Huang | G01R 31/312 | 324/750.3 |
| 2014/0354311 A1* | 12/2014 | Byeon | G11C 29/26 | 324/750.3 |
| 2015/0185274 A1* | 7/2015 | Hwang | G01R 31/318513 | 324/750.3 |
| 2015/0234004 A1* | 8/2015 | Chen | G01R 31/2856 | 324/750.3 |
| 2016/0299190 A1* | 10/2016 | Shim | G01R 31/318513 | |
| 2017/0059648 A1* | 3/2017 | Woo | G01R 31/2853 | |
| 2017/0146598 A1* | 5/2017 | Kim | G11C 29/18 | |
| 2017/0350939 A1* | 12/2017 | Goel | G01R 31/318538 | |
| 2017/0373040 A1* | 12/2017 | Pagani | G01R 31/2884 | |
| 2019/0096776 A1* | 3/2019 | Nishioka | G01R 31/2884 | |
| 2019/0355436 A1* | 11/2019 | Shin | G11C 29/36 | |
| 2020/0006164 A1* | 1/2020 | Yu | H01L 24/83 | |
| 2020/0286798 A1* | 9/2020 | Choi | H01L 22/34 | |
| 2020/0303030 A1* | 9/2020 | Lee | G11C 8/06 | |

OTHER PUBLICATIONS

IEEE P1687 Internal JTAG (IJTAG) Tutorial, Asset Driving Embedded Instrumentation, 2011, Asset InterTech, Inc.

* cited by examiner

US 11,054,461 B1

TEST CIRCUITS FOR TESTING A DIE STACK

TECHNICAL FIELD

The following description relates to integrated circuit devices ("ICs"). More particularly, the following description relates to test circuits for testing a die stack.

BACKGROUND

As die stacks get taller and/or involve more complicated circuits, having multiple arrays of externally accessible pads at an exit level of such die stacks becomes more problematic, including consuming a more significant amount of area. Furthermore, such taller and/or more dense die stacks may have an increase in resistive-capacitive ("RC") parasitic delays and current-resistance ("IR") voltage drops.

SUMMARY

A device relates generally to a die stack. In such a device, the die stack of two or more integrated circuit dies has associated therewith test circuits corresponding to each level of the die stack each with a set of pads. A test data-input path includes being from: a test data-in pad through a test circuit to a test data-out pad of each of the test circuits; and the test data-out pad to the test data-in pad between consecutive levels of the test circuits. Each of the set of pads includes the test data-in pad and the test data-out pad respectively thereof. A test data-output path is coupled to the test data-out pad of a level of the levels.

Another device relates generally to a die stack. In such a device, a die stack region and a test stack region have common substrates respectively for corresponding levels of the die stack. A test data-input path in the test stack region includes being from: a test data-in pad through a test circuit to a test data-out pad of each of the levels; and the test data-out pad to the test data-in pad between consecutive ones of the levels. Each of the set of pads includes the test data-in pad and the test data-out pad respectively thereof. A test data-output path is coupled to the test data-out pad of one of the levels in the test stack region.

A method relates generally to die stacks. In such a method, wafers are bonded to one another to provide the die stacks each with a die stack region and a test stack region for levels thereof. Each of the die stacks includes two or more integrated circuit dies. The bonding of the wafers includes aligning a set of pads in the test stack region for each of the levels to one another for interconnection to provide a test data-input path and a test data-output path. The test data-input path and the test data-output path respectively extend through each of the levels to test all of the two or more integrated circuit dies of each corresponding die stack of the die stacks.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 1-2 is a block diagram depicting a cross-sectional view of another example of a wafer stack.

FIG. 1-3 is a block diagram depicting a cross-sectional view of yet another example of a wafer stack.

FIG. 2-1 is top-down view of a block diagram of an exploded view of an example of a wafer stack having three wafers.

FIG. 2-2 is an enlarged view depicting an example of a block diagram portion of the wafer stack of FIG. 2-1.

FIG. 3 is a block diagram depicting an example of a set of pads.

FIG. 4-1 is a block diagram depicting an example of multiple levels of wafers and corresponding sets of pads.

FIG. 4-2 is a block diagram depicting another example of multiple levels of wafers and corresponding sets of pads.

FIG. 4-3 is a block diagram depicting yet another example of multiple levels of wafers and corresponding sets of pads.

FIG. 5-1 is a block diagram depicting an example of a test circuit.

FIG. 5-2 is a block diagram depicting another example of a test circuit.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Testing a die stack is becoming more problematic with taller die stacks and/or more complex dies. To reduce area consumption at a test data accessible level, a die stack has corresponding wafer-level test circuits configured in a daisy chain. Furthermore, local die level testing may be used to reduce effects of RC parasitic delays and IR voltage drops.

With the above general understanding borne in mind, various configurations for wafer stacks are generally described below.

Figure 1:
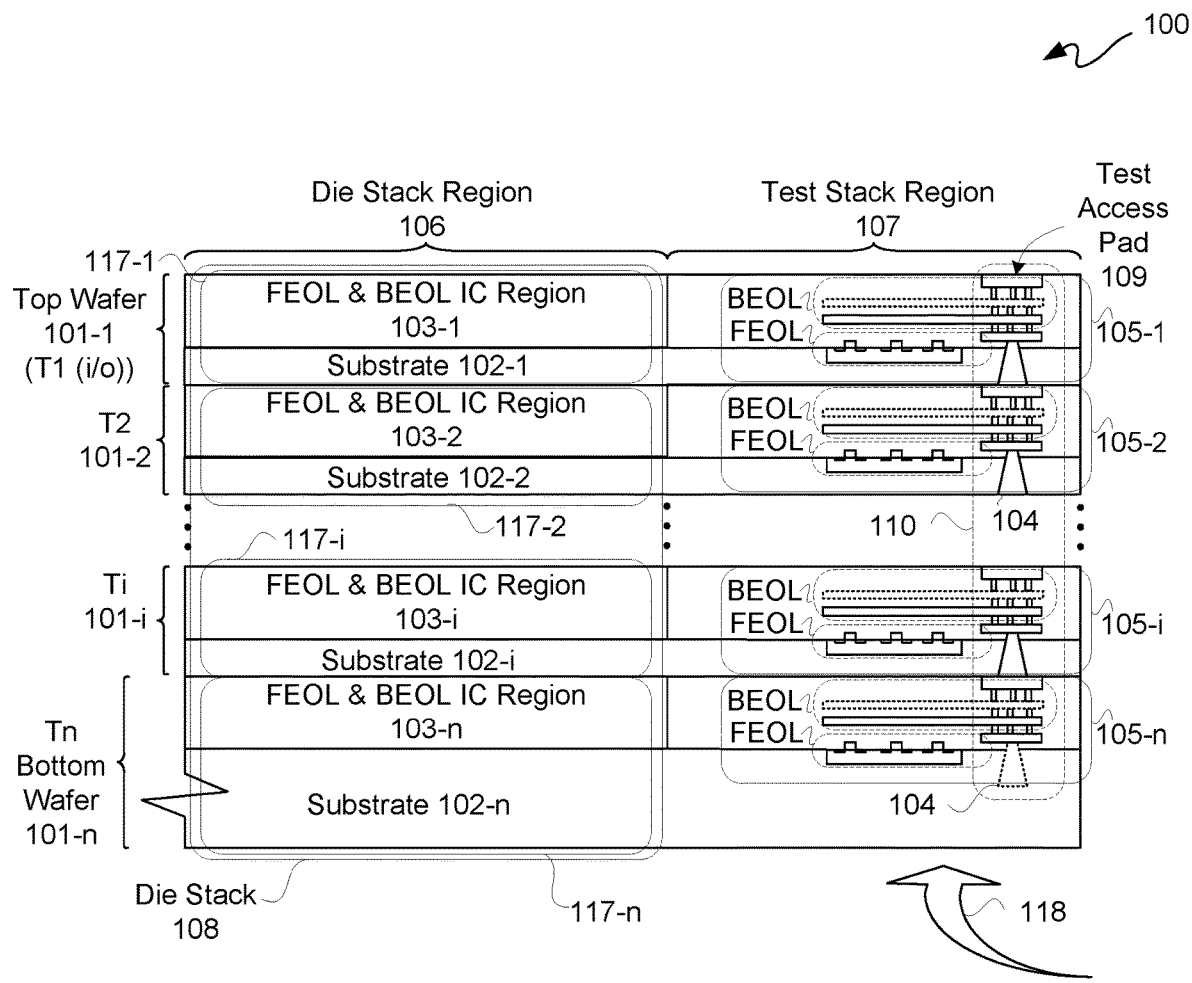
FIG. 1-1 is a block diagram depicting a cross-sectional view of an example of a wafer stack.

FIG. 1-1 is a block diagram depicting a cross-sectional view of an example of a wafer stack 100. Wafer stack 100 may be used to provide die stacks, such as for example die stack 108, for one or more microelectronic devices. Die stack 108 may be formed of two or more integrated circuit dies 117. Even though a single die stack 108 is illustratively depicted for purposes of clarity, a wafer stack 100 may include one or more die stacks 108.

Wafer stack 100 may include a top wafer 101-1, one or more intermediate wafers, such as intermediate wafer 101-2 down to intermediate wafer 101-*i* for example, and a bottom wafer 101-*n*. In this example, there are four or more wafers 101. However, in another example, as few as two wafers 101 may be present. So, generally a die stack 108 may be formed of two or more wafers 101. In this example, i and n are positive integers, where i is one less than n. In general, i can be any positive integer between 2 and n. However, for an example of two wafers 101 and hence two dies 117 in a die stack 108, there would be no intermediate wafer 101-*i*.

Each wafer 101-1 through 101-*n* may include a corresponding substrate 102-1 through 102-*n*. Substrates 102 may be formed of a semiconductor material, such as Si, GaAs, SiGe, or another semiconductor material.

Upper surfaces of substrates 102-1 through 102-*n* may have corresponding FEOL ("front end of line") features formed above such upper surfaces. Subsequent to formation of FEOL features, BEOL ("back end of line") features may be formed above such upper surfaces, as well as above such FEOL features. For an active area die stack region 106 of a wafer stack 100, FEOL and BEOL features are generally indicated as "FEOL & BEOL" integrated circuit ("IC") regions 103-1 through 103-*n* corresponding to wafers 101-1 through 101-*n*. In this example for a test stack region 107 of a wafer stack 100, FEOL and BEOL features are generally indicated as "FEOL & BEOL" IC regions 105-1 through 105-*n* corresponding to wafers 101-1 through 101-*n*. FEOL & BEOL IC regions 105-1 through 105-*n* may be used for providing at least in part wafer- or die-level test circuits, as well as other circuitry, in a test stack region 107. Though test stack region 107 may be wholly, partly or not all in scribeline regions of one or more of wafers 101 of a wafer stack 100, in this example test stack region 107 is wholly in die regions of each of wafers 101 of wafer stack 100. However, by being able to use at least part of a scribeline region of each of wafers 101 of wafer stack 100, some test circuitry as described hereinbelow does not consume corresponding space of wafers 101 allocated to die regions thereof.

FEOL & BEOL IC regions 103-1 through 103-*n* correspond to IC dies 117-1 through 117-*n*. IC dies 117-1 through 117-*n* at this stage of processing may still be in corresponding wafers 101-1 through 101-*n*, but may be diced from wafer stack 100 as part of a die stack 108. IC dies 117-1 through 117-*n* may tested as part of a die stack 108 prior to and after dicing from a wafer stack 100. As a scribeline region may be completely or partially removed by a dicing operation, some wafer-level test circuits, described below in additional detail, associated with FEOL & BEOL IC regions 105-1 through 105-*n* corresponding to wafers 101-1 through 101-*n* may be completely or partially removed by such a dicing operation. However, in this example, conductive stack 110 and test pads, such as test pads 200 of FIG. 2-2 for example, as well as other test circuitry, persist in die stacks 108 after dicing of such dies stacks from wafer stack 100. This test circuitry may be used for testing of individual die stacks 108 after dicing from wafer stack 100.

FEOL features may include transistor source/drain regions and gates, among other features, and BEOL features may include conductive pads, vias and routing, among other features. An FEOL feature may include through substrate vias ("TSVs") 104.

TSVs 104 may be formed in substrates 102 for subsequent alignment with one another. Again, even though single instances of TSVs 104 in corresponding substrates 102 are illustratively depicted, such substrates 102 may have multiple TSVs 104 in accordance with the description herein.

Aligned with TSVs 104 of substrates 102 may be BEOL features, such as for example plugs, conductive vias, conductive pads, and conductive routes. Such TSVs 104, as well as conductive vias, conductive pads, and conductive routes, may be to provide a conductive stack 110, sometimes referred to as a "chimney stack", by coupling wafers 101 one another, such as by hybrid or other bonding for example, with an alignment of TSVs 104 among other features.

In an example, each of wafers 101 may be of a same configuration, and so an unused lowermost TSV 104 may optionally be present. Furthermore, an uppermost surface of a wafer stack 100 may have added thereto a redistribution layer ("RDL"), a passivation layer, and/or other full scale wafer processing layers. Such RDL may be used to provide an externally accessible set of pads that corresponds to an internal set of pads of an uppermost wafer 101-1. For purposes of clarity by way of example and not limitation, such internal set of pads is described below as being externally accessible.

Since additional layering may be formed on an uppermost wafer 101-1, such additional layers may involve a different process flow for uppermost wafers 101-1 as compared with lower wafers thereto. As wafers 101 may be individually tested, including using test circuits as described herein, prior to stacking, an ability to select any of wafers 101 having passed wafer-level testing as an uppermost wafer 101-1 for a wafer stack 100 may be a desirable feature for forming wafer stacks 100.

In this example, each of n wafers 101 is in a face-up orientation 118. A top wafer 101-1, which is an external interface or input/output ("i/o") wafer tier, may have access pads, such as may include a test access pad 109 for example. Test access pad 109 may be connected to or part of a conductive stack 110. Even though a single test access pad 109 and corresponding conductive stack 110 are illustratively depicted, multiple test access pads 109 and corresponding conductive stacks 110 are present in wafer stack 100 for a die stack 108 thereof in accordance with the following description. For purposes of clarity by way of example and not limitation, die stack 108 may be assumed to be an "active-on-active" die stack; however, in another example, die stack 108 may include one or more passive die layers.

In this example, multiple test access pads 109 and corresponding conductive stacks 110 are in a test stack region 107. However, to avoid consuming die stack 108 areas of wafers 101 with test circuits, some test access pads 109 may be in a scribeline region. However, multiple test access pads 109 and corresponding conductive stacks 110 may also or separately be in a die stack region 106.

Figures 1, 2:
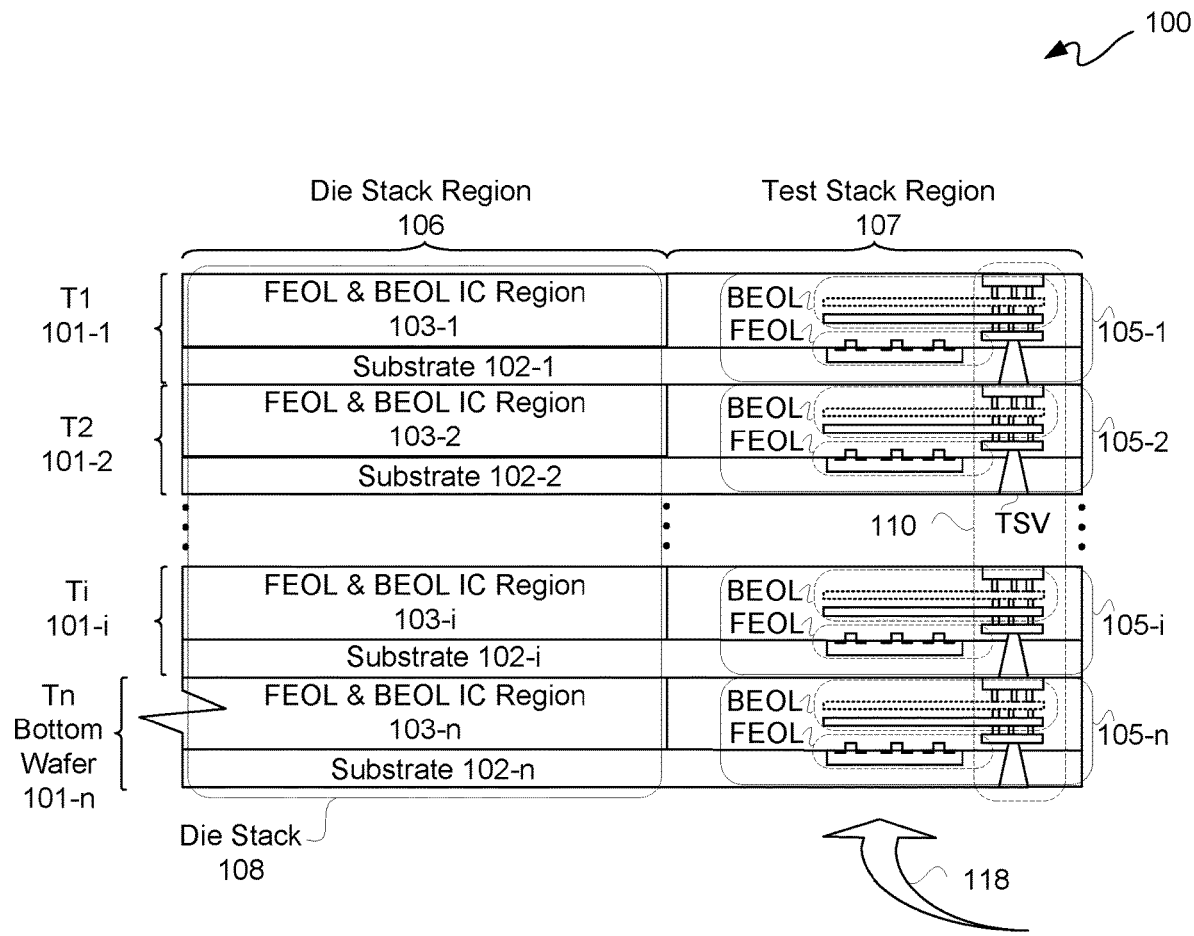

FIG. 1-2 is a block diagram depicting a cross-sectional view of another example of a wafer stack 100. Wafer stack 100 may be to provide die stacks, such as for example die stack 108, for one or more microelectronic devices. Wafer stack 100 of FIGS. 1-1 and 1-2 are the same, except wafer stack 100 has a lowermost wafer 101-*n* with a thinned substrate 102-*n*. A backside thinning of substrate 102-*n* may be used to expose a lower contact surface of an optional TSV 104 thereof for lowermost access to a conductive stack 110, such as for external access for example.

Figures 1, 2, 3:
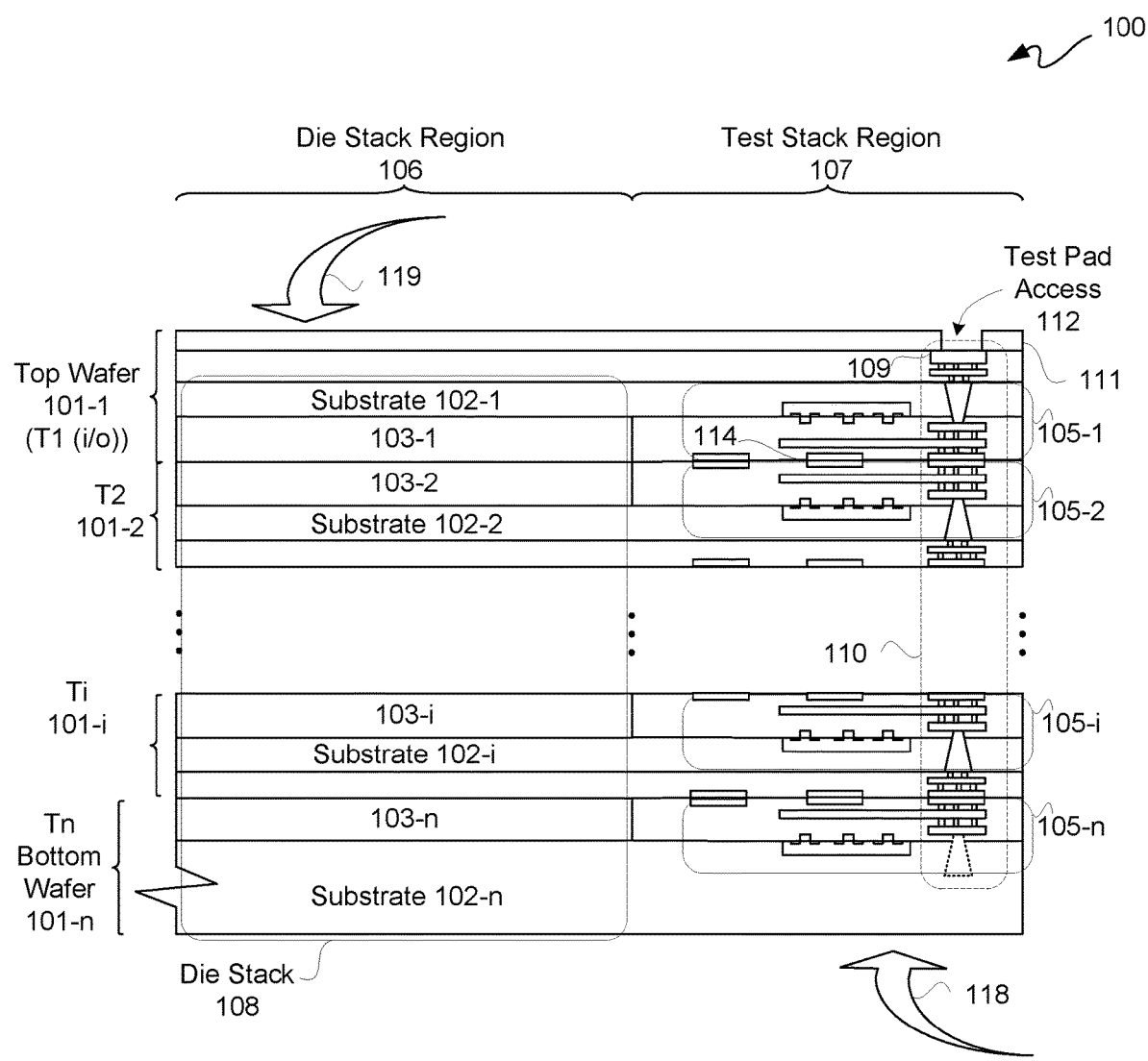
Figures 1, 2:
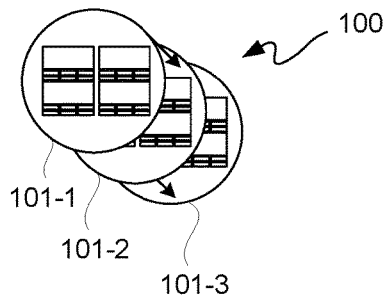
Figure 2:
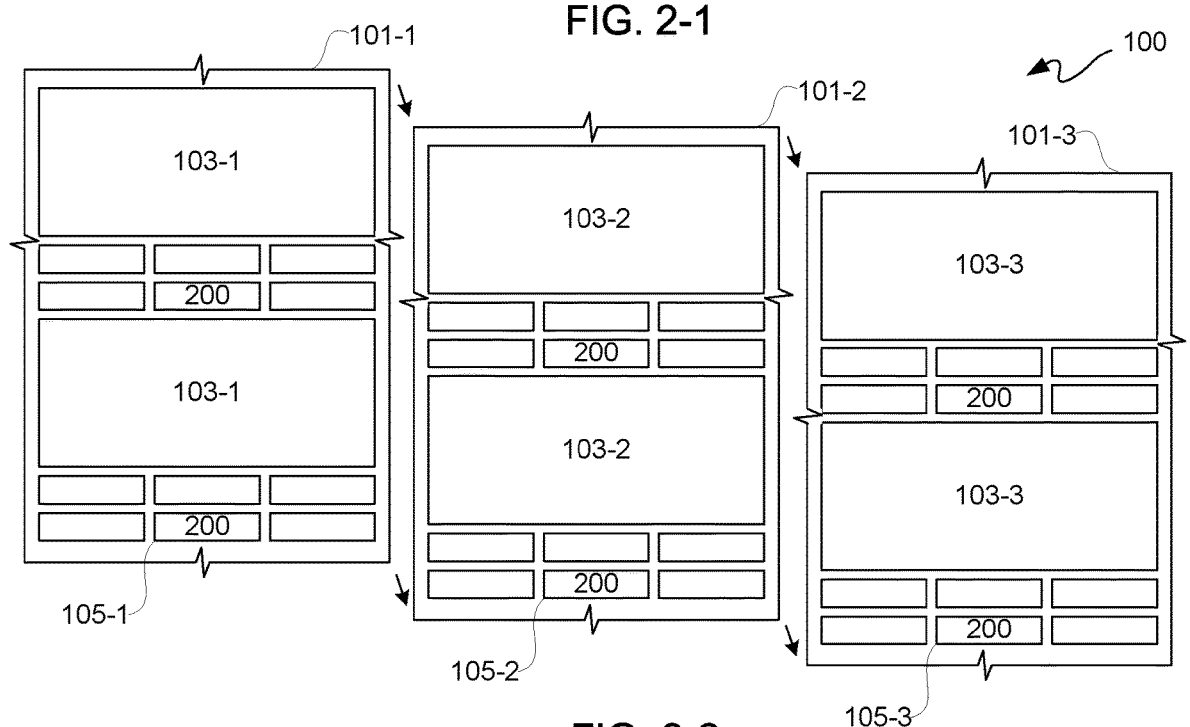
Figure 3:
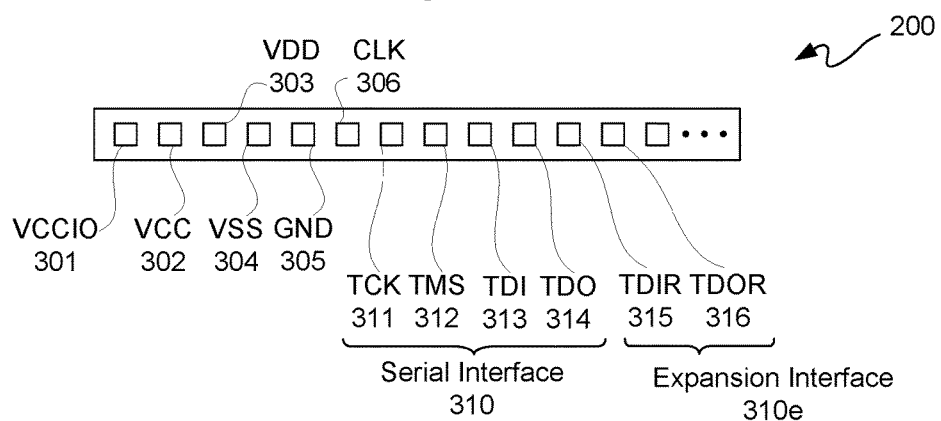

FIG. 1-3 is a block diagram depicting a cross-sectional view of yet another example of a wafer stack 100. Wafer stack 100 may be to provide die stacks, such as for example die stack 108, for one or more microelectronic devices.

Wafer stack 100 of FIGS. 1-1 and 1-3 are the same, except wafer stack 100 has an uppermost wafer 101-1 in a face-down orientation 119 with each lower wafer 101-2 through 101-n in a face-up orientation 118. Accordingly, each die 117-2 through 117-n of die stack 108 is in a face-up orientation, and an uppermost die 117-1 of a die stack 108 is in a face-down orientation 119. This means that a backside of an uppermost substrate 102-1 has contact surfaces of bottoms of TSVs 104 available for forming external contacts, such as for a set of pad described herein.

A backside surface of a substrate conventionally has less contacts than a front side surface of a substrate. Because fewer opportunities exist in a backside surface for contacts, having a reduced number of pads, as described herein, for testing a die stack may be a desirable feature.

In this example, an uppermost wafer 101-1 is bonded to a wafer 101-2 with hybrid bonds 114. Additionally, added to a wafer stack 100 are one or more dielectric layers, such as may include a dielectric or passivation layer 111, formed with a test pad access 112. For example, a hole or trench may be formed through passivation layer 111 down to an upper surface of test access pad 109.

For purpose of clarity by way of example and not limitation, wafer stack 100 of FIG. 1-3 is described below with reference to further examples. However, the following description likewise applies to other configurations of wafer stacks, including other wafer stacks 100 described herein.

FIG. 2-1 is top-down view of a block diagram of an exploded view of an example of a wafer stack 100 having three wafers 101-1 through 101-3. Three wafers 101 are used for purposes of clarity by way of non-limiting example, as fewer or more than three wafers 101 may be used in other examples. FIG. 2-2 is an enlarged view depicting an example of a block diagram portion of a wafer stack 100 of FIG. 2-1.

Again, each die stack 108 in a wafer stack 100 may include two or more integrated circuit dies 117. FEOL & BEOL IC regions 105-1 through 105-3, which may be considered as parts of or associated with such die stack 108 prior to dicing, may include corresponding wafer-level test circuits.

Each of such wafer- or die-level test circuits may include a set of test pads 200. Thus, an uppermost die 117-1, and each lower die 117 with respect thereto, of a die stack 108 can be associated with corresponding wafer- or die-level test circuits each with a set of test pads 200.

Each set of pads 200 may include a test data-in pad and a test data-out pad for communication of data in and out of a die stack 108. Communication of test data may be serial, including either or both single bit or multiple bit serial, and/or parallel as may vary from implementation-to-implementation. For purposes of clarity by way of example, serial communication is used in the following examples; however, other examples may include serial and/or parallel communication in accordance with the following description. Though wafer- or die-level test circuits are not illustratively particularly depicted as being in electrical communication with IC dies 117 of die stack 108 for purposes of clarity, wafer- or die-level test circuits in test stack region 107 are in communication with circuitry (not shown for purposes of clarity) of IC dies 117 in die stack region 106. Along those lines, traces or other routing may extend from die stack region 106 to test stack region 107, and vice versa, for electrical signaling between circuitry of IC dies 117 and corresponding wafer- or die-level test circuits at least for purposes of testing. After dicing, test stack region 107, including portions of traces or other routing thereof, may remain for subsequent testing of individual die stacks 108.

FIG. 3 is a block diagram depicting an example of a set of pads 200. Set of pads 200 may be of a wafer- or die-level test circuit.

In this example, there is a test data-in ("TDI") pad 313 and a test data-out ("TDO") pad 314 in a set of pads 200. TDI pad 313 and TDO pad 314 may be part of a test interface 310. Again, in this example, test interface 310 is a serial interface ("test serial interface 310") for purposes of clarity by way of non-limiting example. However, in another example, a test interface 310 may be a parallel interface.

Such test serial interface 310 may further include a test clock pad 311 and a test mode pad 312. Pads 311 through 314 of test serial interface 310 are associated with a JTAG serial interface in this example. Many types of conventional dies include a conventional set of JTAG pads, namely a set of TMS, TDI, TDO, and TCK pads.

Even though an example of a JTAG interface is used, it should be understood that the description herein is not limited to a JTAG interface, but rather other serial or non-serial test interfaces may be used. However, for purposes of clarity by way of example and not limitation, it shall be assumed that a JTAG interface is used.

A set of test pads 200 may further include a test data-in return ("TDIR") pad 315 and a test data-out return ("TDOR") pad 316. TDIR pad 315 and TDOR pad 316 may be part of an expansion interface 310e. Expansion interface 310e is an expansion of a serial interface 310 in this example.

A set of test pads 200 may further include at least one supply pad, at least one ground pad, and a clock pad 306. In this example, a VCCIO pad 301, a VCC pad 302, and a VDD pad 303 are provided as supply pads. In this example, a VSS pad 304 and a common ground pad 305 are provided as ground pads. Different supply pads may be used depending on voltage level and/or noise level. Likewise, different ground pads may be used depending on voltage level and/or noise level.

Returning to FIG. 2-2, each set of pads 200 for each wafer- or die-level test circuit may be repeated for correspondence with each of IC dies 117-1 through 117-n. This may allow a same set of masks to be used for each wafer 101 in order to reduce costs and simplify manufacture.

Additionally, a single interface of an i/o wafer tier, such as of an uppermost wafer 101-1, may be used to access any of wafers 101 with a persistent interface. In other words, an interface provided by a set of pads 200 may be the same for each of wafers 101, and only an uppermost or lowermost one of such sets of pads may need to be coupled for external access.

A wafer- or die-level test of a die stack 108 may be performed using a single set of test pads 200 of such uppermost wafer 101-1 for accessing each IC die 117 in a wafer stack 100 with a persistent interface. In examples described below, an IJTAG daisy chain is used for this access; however, other forms of test protocol interfaces may be daisy chained in other examples in accordance with the description herein.

Avoidance of multiple sets of pads for access to testing lower layers of IC dies in a die stack consumes less test stack region 107 area at a top of a wafer stack 100. This reducing in the number of externally accessible pads for purposes of testing allows more test stack area for other sets of pads and/or more dies per wafer with smaller test stack regions.

Avoidance of having to populate a test stack area with multiple sets of pads allows for more IC die layers in a die stack. Having more IC die layers in a die stack may be facilitated by generating more area by having fewer pads and/or higher utilization of pads. Along those lines, a single set of pads may persist for each wafer- or die-level test circuit to provide access to each IC die in a die stack 108 of a wafer stack 100. However, only one set of such sets of pads may be coupled to receive external signaling in order to access all IC dies 117 in a die stack 108 of a wafer stack 100.

Continuing the above example of FIGS. 1-3, 2-2 and 3, FIG. 4-1 is a block diagram depicting an example of multiple levels of wafers 101 and corresponding sets of pads 200. In this example, each of wafers 101-1 through 101-3 includes a corresponding set of pads 200-1 through 200-3 of a corresponding wafer- or die-level test circuit 400. In other words, each of wafers 101-1 through 101-3 includes a wafer- or die-level test circuit ("test circuit") 400 including a set of pads 200.

Each test circuit 400 may further include a main circuit portion, namely a test circuit 400-1, and an optional circuit portion, namely a test circuit 400-2. In this example, each test circuit 400 has a same layout in order to simplify manufacturing, as well as to reduce cost by use of a same set of masks. Additionally, test circuits 400 may be formed using a same substrate as IC dies 117.

Pads 301 through 306 of each of wafers 101-1 through 101-3 may be respectively commonly coupled to one another to form corresponding common nodes. For example, a common ground node may be the same node for each of wafers 101-1 through 101-3 at a common ground pad 305 at each of those tiers. Likewise, a common VDD supply node may be the same node for each of wafers 101-1 through 101-3 at a VDD supply pad 303 at each of those tiers. While one or more of common ground and supply nodes, as well as a common clock node, may be connected to test circuits 400-1 and 400-2, such connections are not illustratively depicted for purposes of clarity and not limitation.

TCK pad 311 and TMS pad 312 of each of wafers 101-1 through 101-3 may be respectively commonly coupled to one another to form corresponding common nodes. Each common TCK node may be connected via a TCK pad 311 to a test circuit 400-1 of a same wafer 101. Likewise, each common TMS node may be connected via a TMS pad 312 to a test circuit 400-1 of a same wafer 101.

A TDI pad 313-1 may be connected to a test circuit 400-1 of a wafer 101-1 to receive input test data, serial or parallel. An output node 419 of a test circuit 400-1 of a wafer 101-1 may be directly connected to a TDO pad 314-1 and a TDOR pad 316-1 of such a wafer 101-1 associated with a corresponding IC die 117-1. If an optional test circuit 400-2 is present, then an output node 419 may be directly connected to test circuit 400-2 instead of being directly connected to a TDOR pad 316-1, as well as being directly connected to a TDO pad 314-1. TDO pad 314-1 of wafer 101-1 is coupled to TDI pad 313-2 of wafer 101-2. TDIR pad 315-1 of wafer 101-1 is coupled to TDOR pad 316-2 of wafer 101-2.

A TDI pad 313-2 may be connected to a test circuit 400-1 of a wafer 101-2 to receive serial input test data from a TDO pad 314-1 of an adjacent or consecutive upper level wafer 101-1. An output node 419 of a test circuit 400-1 of a wafer 101-2 may be directly connected to a TDO pad 314-2 and a TDOR pad 316-2 of such a wafer 101-2 associated with a corresponding IC die 117-2. If an optional test circuit 400-2 is present, then output node 419 of wafer 101-2 may be directly connected to test circuit 400-2, same or similar as previously described for wafer 101-1. TDO pad 314-2 of wafer 101-2 is coupled to TDI pad 313-3 of wafer 101-3. TDIR pad 315-2 of wafer 101-2 is coupled to TDOR pad 316-3 of wafer 101-3.

Lastly for this example, a TDI pad 313-3 may be connected to a test circuit 400-1 of a wafer 101-3 to receive serial input test data from a TDO pad 314-2 of an adjacent or consecutive upper level wafer 101-2. An output node 419 of a test circuit 400-1 of a wafer 101-3 may be directly connected to a TDO pad 314-3 and a TDOR pad 316-3 of such a wafer 101-2 associated with a corresponding IC die 117-3. If an optional test circuit 400-2 is present, then output node 419 of wafer 101-3 may be directly connected to test circuit 400-2, same or similar as previously described for wafer 101-1. As there is no next level wafer in this example, TDO pad 314-3 of wafer 101-3 may be unconnected. Similarly, a TDIR pad 315-3 of wafer 101-3 may be left unconnected.

Through each tier or level of wafers 101, a test data-input path 420 internal to die stack 108 is provided to include an input daisy chain ("input daisy chain 420"), illustratively depicted by a dashed line. Input daisy chain 420 passes through each test circuit 400-1 of wafers 101, using TDI 313 and TDO 314 pads as previously described.

In general, an input daisy chain 420 passes from a TDI pad 313 to a TDO pad 314 within each wafer level for corresponding IC dies 117 in a die stack 108 and passes from a TDO pad 314 immediately above with respect to a lower TDI pad 313 between adjacent or consecutive wafer levels of test circuits 400 corresponding to IC dies 117 in a die stack 108.

A test data-output path 421 internal to die stack 108 in this example is an output daisy chain ("output daisy chain 421"), illustratively depicted by a dotted-dashed line. In this example, through each tier or level of wafers 101, a test data-output path internal to die stack 108 is provided to include an output daisy chain 421. Output daisy chain 421 passes through each test circuit 400-2 of wafers 101, using TDIR 315 and TDOR 316 pads as previously described.

In general, an output daisy chain 421 passes from a TDIR pad 315 to a TDOR pad 316 within each wafer level for corresponding IC dies 117 in a die stack 108. Such output daisy chain 421 passes from a TDOR pad 316 immediately below with respect to a lower TDIR pad 315 between adjacent or consecutive wafer levels of test circuits 400 for corresponding IC dies 117 in a die stack 108.

Figures 1, 4:
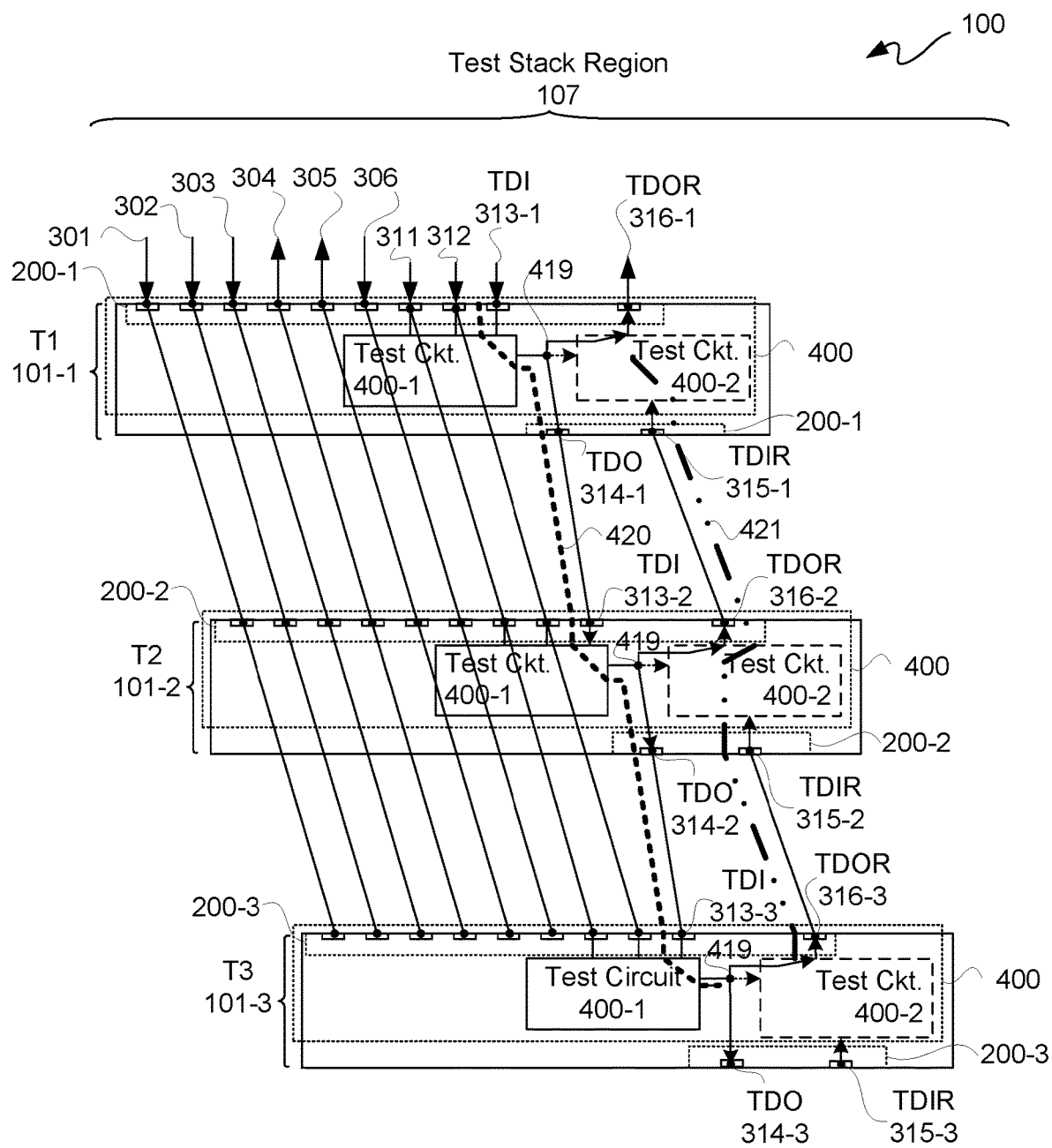
Figures 2, 4:
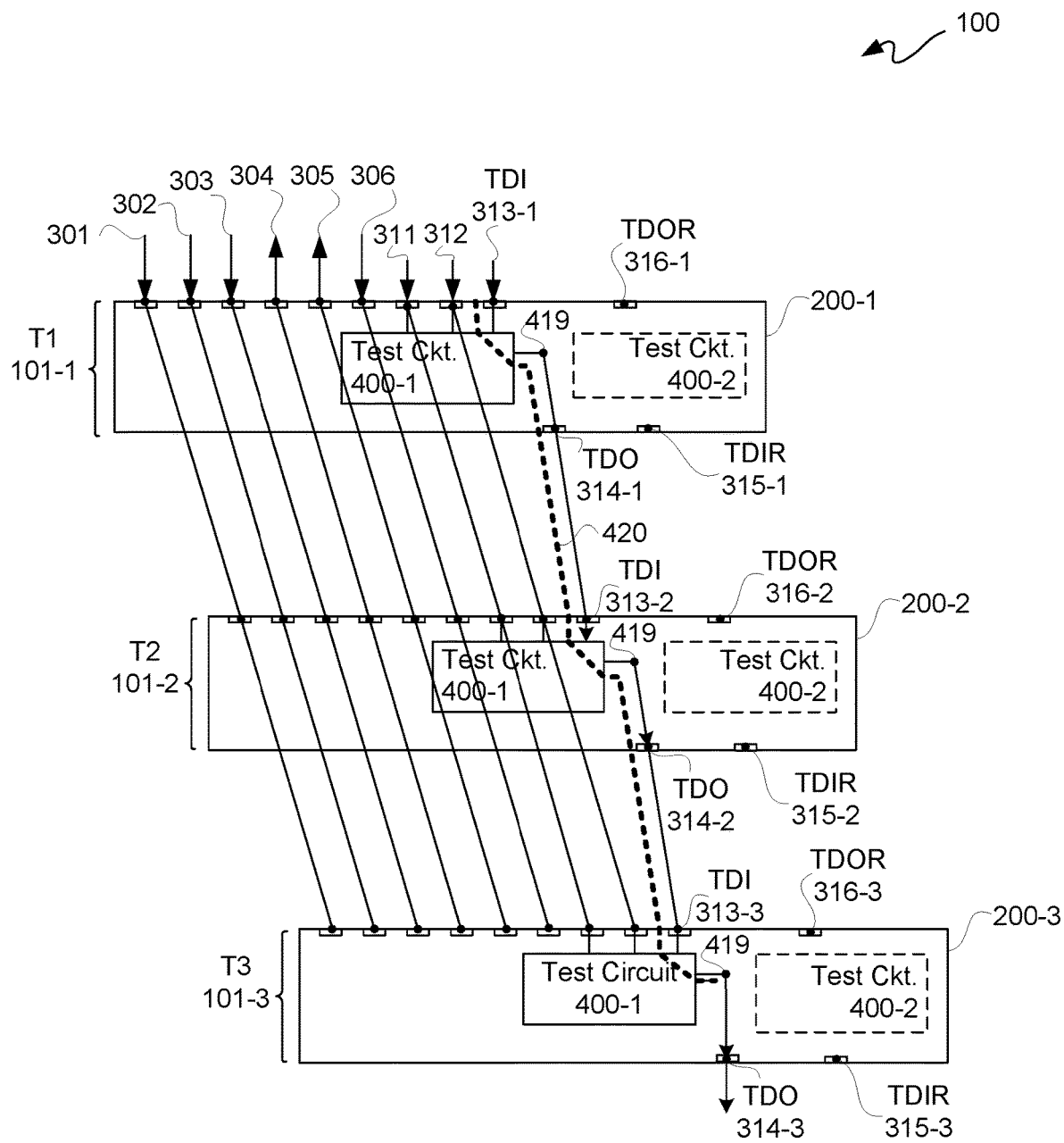
Figures 3, 4:
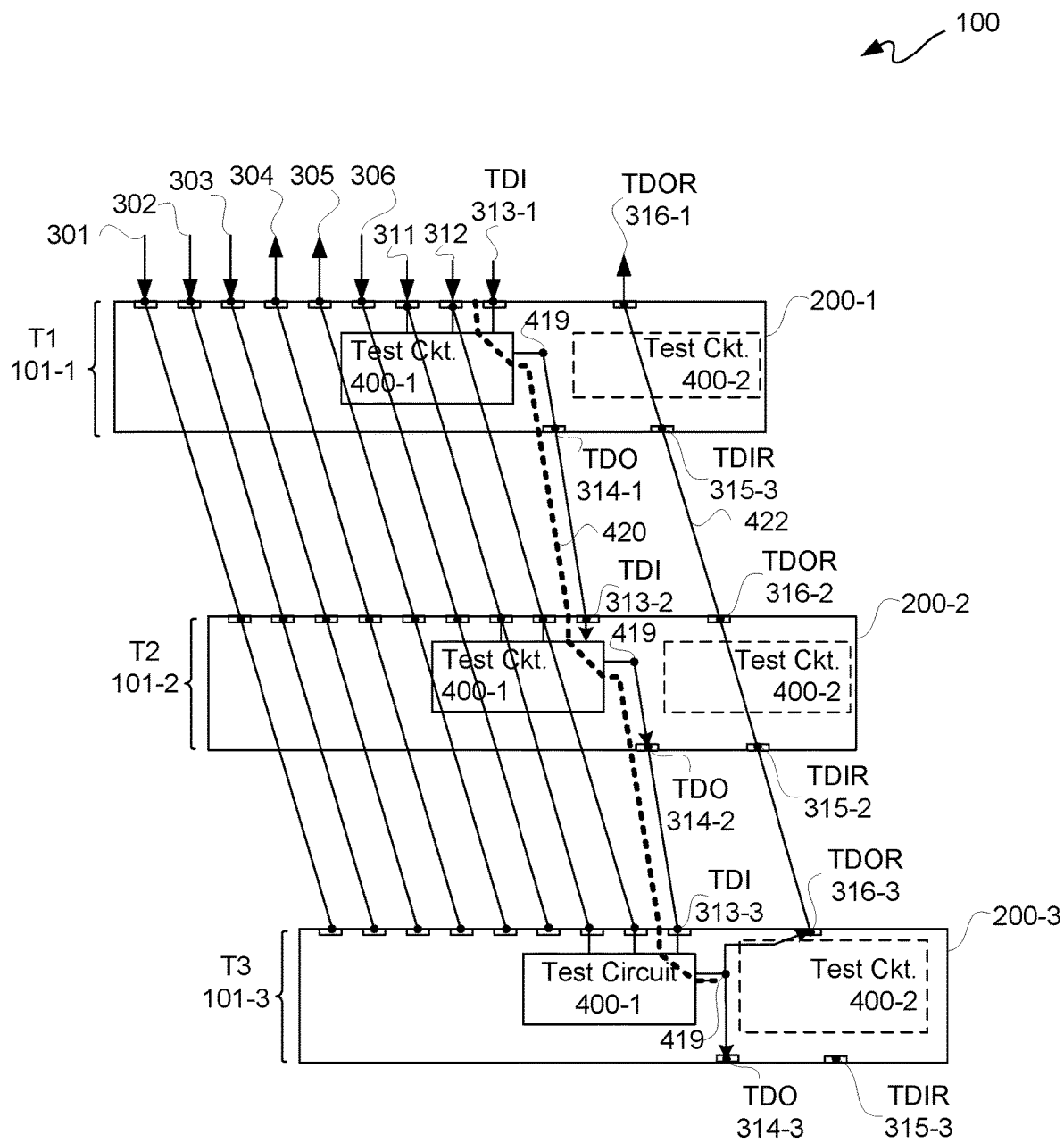

FIG. 4-2 is a block diagram depicting another example of multiple levels of wafers 101 and corresponding sets of pads 200. FIG. 4-2 is the same as FIG. 4-1, except rather than an output daisy chain, test data output is directly obtained from a TDO pad 314-3 or TDOR pad 316-3 of a lowermost wafer 101-3. Accordingly, an output daisy chain 421 need not be used or implemented in this example. Rather, output data may be obtained directly from either test data output pad without propagating such output data back up to an uppermost die 117-1 of a die stack 108.

In this example, test circuits 400-2 may be unused, as illustratively depicted. Along those lines, connections to and from test circuits 400-2 may be programmable, such as with pass gates and control signals. In another example, test circuits 400-2 may be omitted.

Access from a lowermost wafer 101-3 may involve thinning a substrate of such lowermost wafer for a backside reveal of TSVs 104 thereof. While wiring in each of wafers 101 may persist as described with reference to FIG. 4-1, such wiring is not shown in this example for purposes of clarity and not limitation to indicate that pass gate programming is used to disconnect test circuits 400-2.

FIG. 4-3 is a block diagram depicting another example of multiple levels of wafers 101 and corresponding sets of pads 200. FIG. 4-3 is the same as FIG. 4-1, except a bypass path of an output daisy chain 421 is used, which is referred to for purposes of clarity as a bypass daisy chain or direct return path 422.

A lowermost wafer, wafer 101-3 in this example, may use a connection between a test circuit 400-1 output node 419 to a TDOR pad 316-3 via a bypass path of a multiplexer of test circuit 400-2 for direct routing of test data output via a bypass daisy chain or direct return path 422 to an uppermost TDOR pad 316-1.

In this example, test data output is illustratively indicated as being directly obtained from a TDOR pad 316-3 of a lowermost wafer 101-3 for clarity. However, a bypass path by way of pass gate programming or multiplexing in an associated test circuit 400-2 may be used for this coupling. Thereafter, by coupling TDOR to TDIR pads through each associated bypass multiplexer of test circuit 400-2 for each upper tier of wafers 101, a bypass daisy chain or direct return path 422 may be provided. In general, TDOR pads of each wafer- or die-level test circuit 400 are sequentially coupled to one another with intervening ones of TDIR pads and optional test circuits 400-2 of such wafer- or die-level test circuits 400 to provide a direct return output path 422.

In this example, an output daisy chain 422 in effect may be used, though through a bypass path in each of test circuits 400-2. Again, while wiring in each of wafers 101 may persist as described with reference to FIG. 4-1, such wiring is not shown in this example for purposes of clarity and not limitation to indicate that pass gate or multiplex programming is used to multiplex within test circuits 400-2 for such a daisy chained bypass or direct test data return path 422, which may be differentiated from a registered test data return path using output daisy chain 421.

Figures 1, 5:
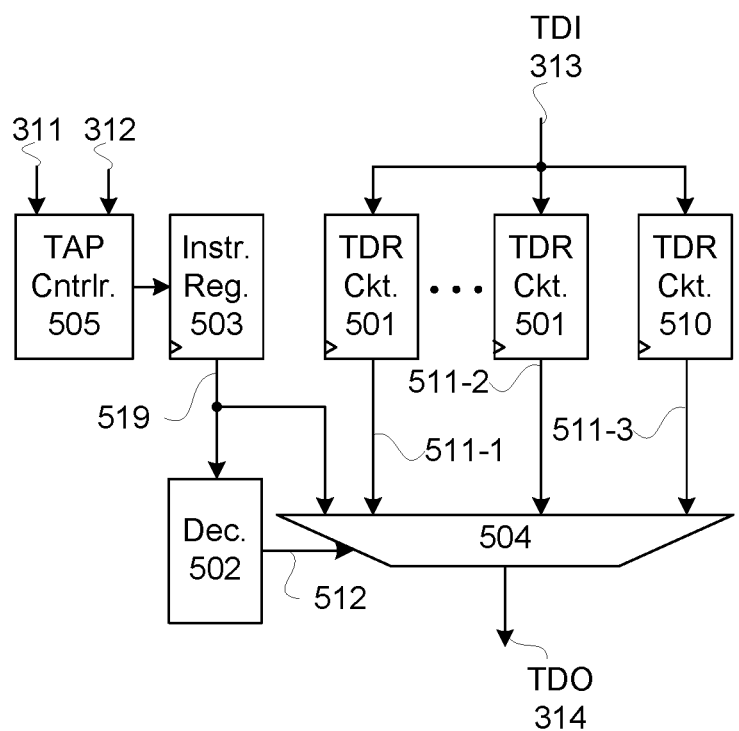
Figures 2, 5:
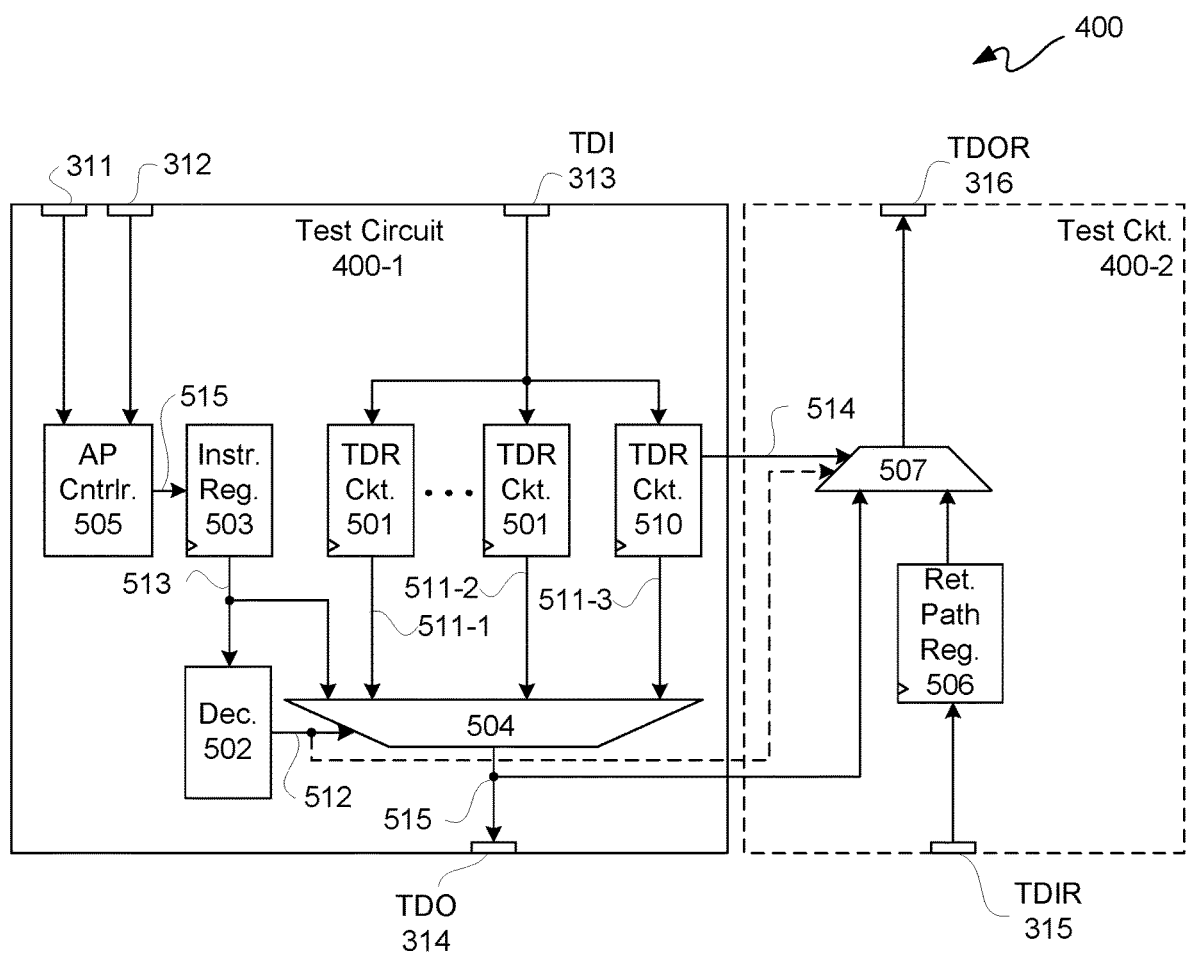

FIG. 5-1 is a block diagram depicting an example of a test circuit 400. More particularly, test circuit 400 is an example of a main portion of a test circuit, namely test circuit 400-1. Each of test circuits 400-1 of wafers 101 may have a same configuration.

A test clock and a test mode select may respectively be provided via common TCK and TMS nodes via corresponding pads 311 and 312 to each test access port ("TAP") controller 505. Again, an example of a JTAG and iJTAG implementation is provided for purposes of clarity and not limitation. Accordingly, daisy chaining as described herein is not limited to these particular test interface and internal test protocols or specifications, but rather may be used with other serial test data specifications.

A TAP controller 505, which is known, may be coupled to an instruction register 503 to receive and register an instruction therein. A decoder 502 may be coupled to instruction register 503 to decode a received registered instruction 519 therefrom to provide a select signal 512 to a multiplexer 504.

One or more test data register ("TDR") circuits 501 may be commonly coupled to receive input data from a TDI pad 313 of a corresponding wafer level. In this example, one or more TDR circuits 501 may each be known JTAG TDR circuits including corresponding serial shift registers configured to provide respective test data outputs responsive to received test data input. In this example test data outputs 511-1 and 511-2 respectively from TDR circuits 501 may be provided as respective data inputs to multiplexer 504. A clock signal for clocking TDR circuits 501 is not shown for purposes of clarity and not limitation.

Another TDR circuit 510, which likewise is commonly coupled with one or more TDR circuits 501 to receive input data from a TDI pad 313 of a same wafer level, may include a serial shift register as well as a hierarchy of one or more other circuits. In this example, TDR circuit 510 is an IJTAG TDR circuit. A test data output 511-3 from TDR circuit 510 may be provided as another data input to multiplexer 504. A clock signal for clocking TDR circuit 510 is not shown for purposes of clarity and not limitation.

Multiplexer 504 may further be coupled to receive instruction 519 as yet another data input thereto. Responsive to selection by select signal 512, multiplexer 504 may be configured to select a data output to a TDO pad 314 or other pad, as previously described herein, of such a wafer level.

Along those lines, responsive to TMS and clocking, data may be shifted down an input daisy chain 420, where such data may include input data, output data, or an instruction. For example, multiplexer 504 accordingly may be implemented using pass gates. As levels may be bypassed with respect to TDR circuit 510, length of input daisy chain 420, as well as output daisy chain 421 as described below in additional detail, may be programmed. A programmable daisy chain length may be used to test different sets of levels or different individual levels during a test sequence.

In another example, a fixed input and output length may be used for daisy chains 420 and 421. In such an example, an instruction 519 is provided to multiplexer 504, as an instruction may be used to inform a test circuit 400 whether or not it is to be used or bypassed for a test sequence. For a fixed input and output length, each stage of such daisy chains 420 and 421 may be used.

FIG. 5-2 is a block diagram depicting another example of a test circuit 400. More particularly, test circuit 400 is an example of a main portion and an optional portion of a test circuit, namely test circuits 400-1 and 400-2, respectively. Each of optional test circuits 400-2 of wafers 101 may have a same configuration. FIGS. 5-1 and 5-2 are the same, except for the following additions.

A test data output node 515 of multiplexer 504 may be coupled to a data input port of multiplexer 507 of test circuit 400-2. Test data output node 515 may be used as a bypass node to bypass TDO pad 314.

TDR circuit 510 may be configured to generate a select signal 514. In another example, select signal 512 output from decoder 502 may optionally be provided to multiplexer 507 in place of or to be used instead of select signal 514. In an example, a programmable interconnect may be used to connect either select signal 512 or 514 to multiplexer 507.

Select signal 514 may be provided as a select command to multiplexer 507. As previously described, multiplexer 507 may be used for a bypass return data path, namely bypass daisy chain or direct return path 422.

A return path register 506 of test circuit 400-2 may be coupled to TDIR pad 315 of an associated wafer level to receive returned output data. Return path register 506 may be coupled to provide returned input data to an input port of multiplexer 507.

Responsive to select signal 514, multiplexer 507 may select TDO or TDIR data for output as test data output returned to TDOR pad 316 of an associated wafer level. Accordingly, an output daisy chain 421 through multiplexers 507 and return path registers 506 may be provided. In another example, one or more return path registers 506 may be bypassed using a bypass path of multiplexer 507 for a programmable length of an output daisy chain 421.

Each of return path registers 506 may be bypassed for providing each test data-out onto a bypass daisy chain or direct return path 422 using a bypass path of multiplexer 507 to provide a serial test data output. Again, even though daisy chains through multiple levels have been described, as well as a direct output from a lowermost layer, a top IC die 117 of a die stack 108 may communicate with an individual die on any level of die stack 108 using serial programming of input and output daisy chains. Along those lines, an individual die level may be reached and a return path may be programmed.

As previously described, test circuits, as described herein, may be used for wafer- or die-level testing of dies 117 of a wafer 101 prior to forming wafer stacks 100. Along those lines, pre-stacking test data may be checked for one or more semiconductor process excursions, as well as baseline performance, prior to stacking dies 117. After forming wafer stacks 100, device functionality and performance may be tested for each die 117 and each die stack 108, and test data obtained therefor using test circuitry as described herein may be obtained. More particularly, using test circuitry as described herein, device functionality and performance may be tested for: each individual die 117 or tier of a die stack 108, each die stack 108 as a whole, and/or combinations of dies 117 in a die stack 108. Because a stacking process may result in a degradation of functionality and/or performance of a die 117, such as for example due to thermal cycling and/or structural stressors, among other factors, post-stacking test data may be compared with pre-stacking test data. By comparing before and after stacking test data of each tier or die 117 of a die stack 108, one or more process excursions may be identified. Furthermore, post-stacking data, including pre-dicing and/or post dicing test data, may be used to check yield and final performance, such as for die stack grading, of die stacks 108.

Figure 6:
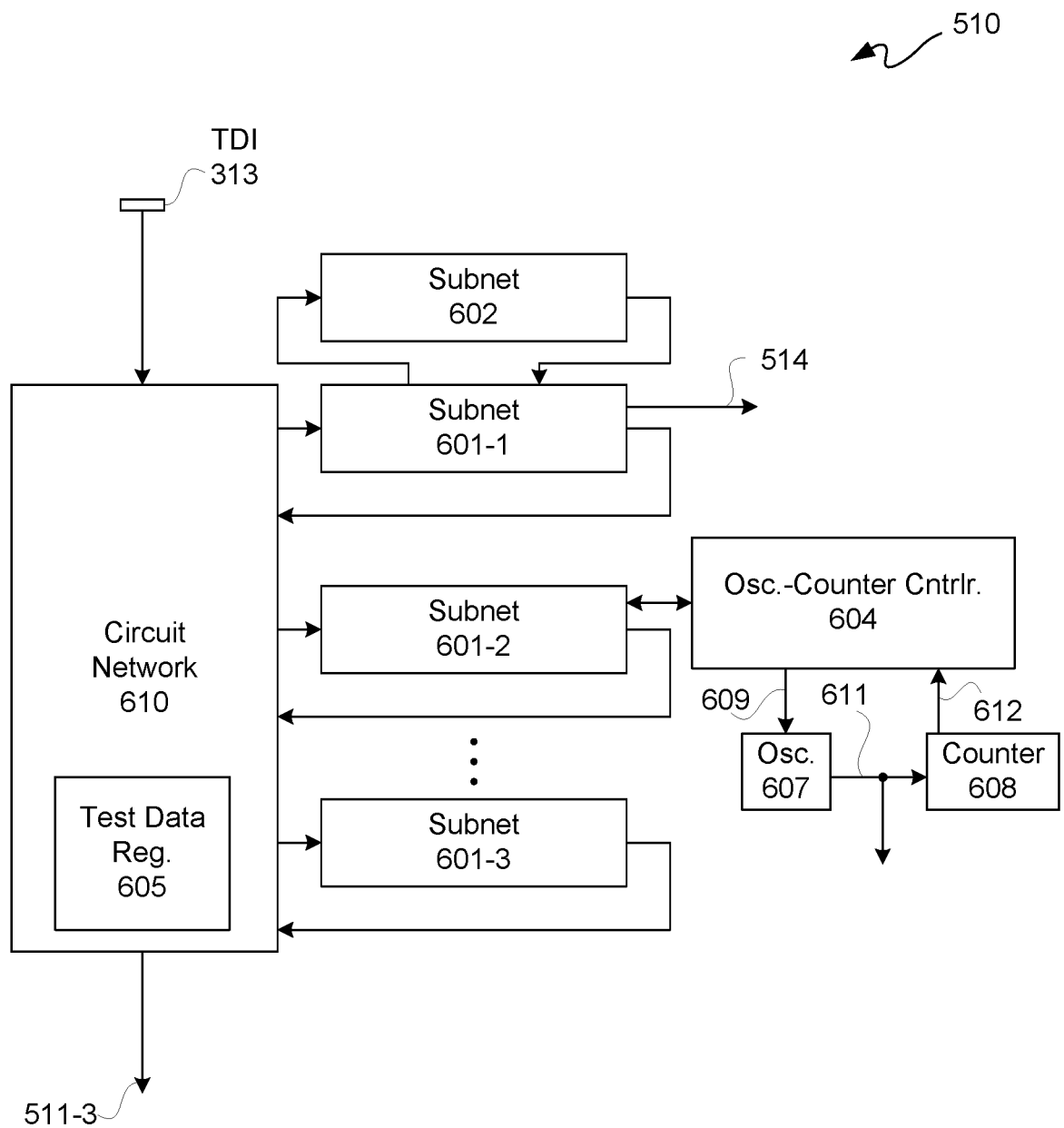
FIG. 6 is a block diagram depicting an example of test data register circuit.

FIG. 6 is a block diagram depicting an example of TDR circuit 510. While multiple hierarchical circuit levels of TDR circuit 510 are described in this example, more generally two or more hierarchical circuit levels may be implemented.

TDR circuit 510 may include a circuit network 610 including a test data register 605. TDR circuit 510 may include at least one circuit subnetwork, such as one or more of subnets 601-1 through 601-3, coupled to circuit network 610. In this example, circuit network 610 may be an IJTAG first/main hierarchical tier net, and subnets 601-1 through 601-3 may be IJTAG second hierarchical tier nets.

Circuit network 610 may receive input test data via a TDI pad 313. Circuit network 610 may provide output test data 511-3, as previously described.

Each of subnets 601 may be configured to receive respective inputs from circuit network 610 and provide respective outputs to circuit network 610. In this example, subnet 601-1 may be further configured to generate a select signal 514.

Additional hierarchies of circuits may be coupled to subnets 601. In this example, an IJTAG third hierarchical tier net, namely circuit subnet 602, may be coupled in a data loop with subnet 601-1.

TDR circuit 510 may include an oscillator-counter controller 604 coupled to circuit network 610. In this example, oscillator-counter controller 604 may be coupled to circuit network 610 through subnet 601-2. Oscillator-counter controller 604 may be considered part of an IJTAG third hierarchical tier net.

An oscillator 607 may be coupled to oscillator-counter controller 604 to receive an activation signal 609 and to provide an oscillating output 611. A counter 608 may be coupled to oscillator 607 to receive oscillating output 611 and to provide a count output 612 to oscillator-counter controller 604. Having local wafer- or die-level oscillators 607 on corresponding wafers 101 may allow for less propagation delay, RC parasitic delay, and/or IR drop impact than propagating oscillator signaling externally with respect to a die stack 108.

Figure 7:
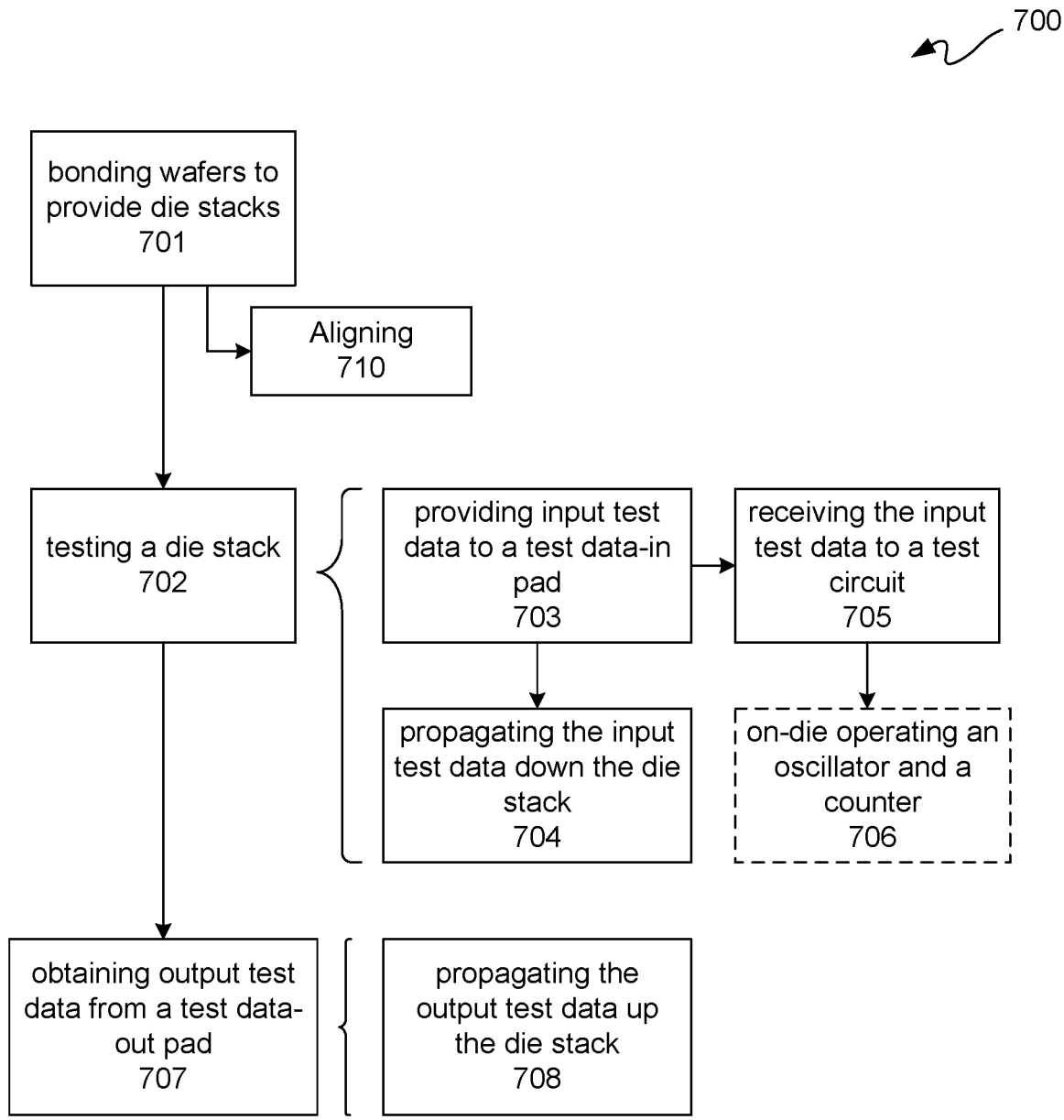
FIG. 7 is a flow diagram depicting an example of a test data flow for a microelectronic device.

FIG. 7 is a flow diagram depicting an example of a test data flow 700 for a microelectronic device. Examples of a microelectronic device were previously described with reference to FIGS. 1-1 through 6, and accordingly test data flow 700 is further described with simultaneous reference to FIGS. 1-3 through 7.

At 701, wafers 101 are bonded to one another to provide die stacks 108 with each die stack thereof having two or more integrated circuit dies 117. Each die stack 108 of such bonded wafers 101 having a die stack region and a test stack region for levels thereof. An uppermost die and each lower die thereof a die stack 108 may have respective test circuits 400 each with a set of pads 200.

Bonding at 701 may include at 710 aligning a set of pads in a test stack region for each of the levels of a die stack 108 to one another for interconnection to provide a test data-input path and a test data-output path. A test data-input path and test data-output path may respectively extend through each of such levels, as previously described, so a single test data-input path and a single test data-output path may be provided to support all levels in a die stack 108. Along those lines, test data-input path and a test data-output path may respectively extend through each of the levels of a die stack 108 to support testing of all of two or more integrated circuit dies thereof.

To this point, it has been assumed that each wafer level includes a test circuit 400 for purposes of clarity and not limitation. However, for a wafer stack 100 with one or more passive levels, one or more corresponding test circuits 400 may be omitted. However, for purposes of clarity by way of example and not limitation, it shall be assumed that each level of a wafer stack 100 includes a corresponding test circuit 400.

At 702, a die stack 108 of such die stacks may be tested. Each of the two or more integrated circuit dies in a die stack 108 may be tested via access through an uppermost one of a set of pads. Testing at 702 may include operations at 703 through 706.

At 703, input test data may be provided to a TDI pad 313-1 of a set of pads 200 of an uppermost die 117-1. At 704, such input test data may be propagated, such as down for example, through an input daisy chain 420 of test circuits 400 for corresponding die levels or dies 117 of a die stack 108. Such input daisy chain 420 may be as previously described.

At 705, input test data may be received by a test circuit 400-1 of test circuits 400. Optionally, at 706, there may be on-die operating of an oscillator 607 and a counter 608 of a test circuit 400 for a corresponding level of die stack 108. Along those lines, multiple oscillators 607 may be operated for testing corresponding levels of IC dies 117 of a die stack 108.

At 706, output test data may be generated with such on-die operating of oscillator 607 and counter 608 local to a corresponding level of die stack 108 for output via test circuits 400. However, in another example, an external clock signal may be propagated for operation for testing of one or more dies 117 of a die stack 108, as well as test circuits 400.

At 707, output test data may be obtained. In an example, output test data may be obtained from a TDO or TDOR pad of a lowermost test circuit 400 without propagation thereof up to an uppermost test circuit 400 of test circuits 400 coupled in at least one daisy chain.

In another example, output test data may be obtained at 707 from a TDOR pad of a set of pads 200 of an uppermost test circuit 400 of an output daisy chain 421. In this example of obtaining output test data at 707, such output test data may, at 708, be propagated, such as for example up, through an output daisy chain 421 or 422 of optional circuit portions 400-2 of test circuits 400. Propagating of input test data at 704 and propagating output test data at 708 may be for a programmed length of input daisy chain 420 and output daisy chain 421 or 422.

Each of IC dies 117 may be same or different types of dies. For purposes of clarity by way of example and not limitation, an FPGA or other IC die may be stacked. Because one or more of the examples described herein may be implemented using an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 8:
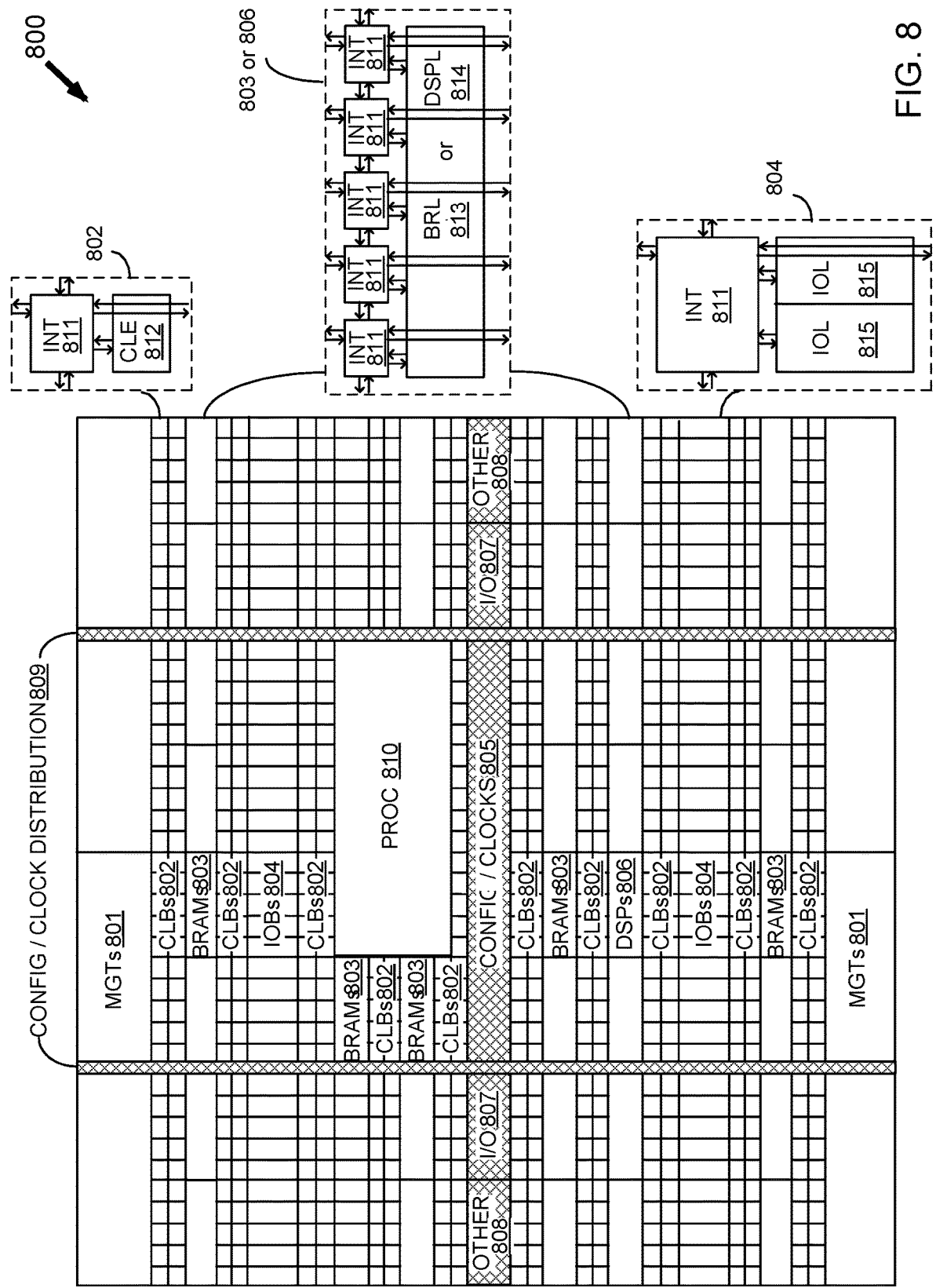
FIG. 8 is a simplified block diagram depicting an exemplary columnar Field Programmable Gate Array ("FPGA") architecture.

As noted above, advanced FPGAs can include several different types of programmable logic blocks in the array. For example, FIG. 8 illustrates an FPGA architecture 800 that includes a large number of different programmable tiles including multi-gigabit transceivers ("MGTs") 801, configurable logic blocks ("CLBs") 802, random access memory blocks ("BRAMs") 803, input/output blocks ("IOBs") 804, configuration and clocking logic ("CONFIG/CLOCKS") 805, digital signal processing blocks ("DSPs") 806, specialized input/output blocks ("I/O") 807 (e.g., configuration ports and clock ports), and other programmable logic 808 such as digital clock managers, analog-to-digital converters, system monitoring logic, and so forth. Some FPGAs also include dedicated processor blocks ("PROC") 810.

In some FPGAs, each programmable tile includes a programmable interconnect element ("INT") 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 can include a configurable logic element ("CLE") 812 that can be programmed to implement user logic plus a single programmable interconnect element ("INT") 811. A BRAM 803 can include a BRAM logic element ("BRL") 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element ("DSPL") 814 in addition to an appropriate number of programmable interconnect elements. An 10B 804 can include, for example, two instances of an input/output logic element ("IOL") 815 in addition to one instance of the programmable interconnect element 811. As will be clear to those of skill in the art, the actual I/O pads connected, for example, to the I/O logic element 815 typically are not confined to the area of the input/output logic element 815.

In the pictured embodiment, a horizontal area near the center of the die (shown in FIG. 8) is used for configuration, clock, and other control logic. Vertical columns 809 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 810 spans several columns of CLBs and BRAMs.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A device, comprising:
   a die stack of two or more integrated circuit dies with associated test circuits corresponding to each level of the die stack, each of the test circuits has a set of pads;
   a test data-input path routed from:
      a test data-in pad through a test circuit to a test data-out pad of each of the test circuits; and
      the test data-out pad to the test data-in pad between consecutive levels of the test circuits;
   each of the set of pads including the test data-in pad and the test data-out pad respectively thereof;
   a test data-output path coupled to the test data-out pad of a level of the levels, wherein the set of pads further comprises a test data-in return pad and a test data-out return pad, and wherein the test data-output path routed from:
      the test data-out pad through the test circuit to the test data-out return pad of each of the test circuits; and
      the test data-out return pad connected to the test data-in return pad between consecutive ones of the levels of the test circuits.

2. The device according to claim 1, wherein:
   the set of pads further comprises a supply pad, a ground pad, a system clock pad, a test clock pad, and a test mode select pad; and
   the supply pad, the ground pad, the system clock pad, the test clock pad, and the test mode select pad of each of the test circuits are respectively coupled to one another to provide corresponding common nodes with respect to each of the test circuits.

3. The device according to claim 1, wherein:
   the set of pads comprises a system supply pad, an input/output supply pad, a ground pad, a system clock pad, a test clock pad, and a test mode select pad; and
   the system supply pad, the input/output supply pad, the ground pad, the system clock pad, the test clock pad, and the test mode select pad are respectively coupled to one another to provide corresponding common nodes with respect to each of the test circuits.

4. The device according to claim 1, wherein each of the test circuits comprises:
   a test access port controller;
   an instruction register coupled to the test access port controller to receive an instruction;
   a decoder configured to decode the instruction to provide a select signal;
   test data register circuits commonly coupled to receive input data from the test data-in pad associated therewith and configured to provide respective test data outputs; and
   a multiplexer coupled to receive the instruction, the test data outputs, and the select signal to select a data output to the test data-out pad associated therewith.

5. The device according to claim 4, wherein:
   the multiplexer and the select signal respectively are a first multiplexer and a first select signal; and
   a test data register circuit of the test data register circuits is configured to provide a second select signal to a second multiplexer.

6. The device according to claim 5, wherein each of the test circuits comprises:
   a return path register coupled to the test data-in return pad; and
   the second multiplexer coupled to receive input returned data from the test data-in return pad, the data output, and the second select signal to select output returned data to the test data-out pad.

7. The device according to claim 6, wherein the test data register circuit comprises:
   a circuit network including a register;
   at least one circuit subnetwork coupled to the circuit network;
   an oscillator-counter controller coupled to the circuit network;
   an oscillator coupled to the controller to receive an activation signal and to provide an oscillating output; and
   a counter coupled to the oscillator to receive the oscillating output and to provide a count output to the oscillator-counter controller.

8. The device according to claim 4, wherein:
   the multiplexer is a first multiplexer;
   a second multiplexer is coupled to receive the select signal; and
   each of the test circuits comprises:
      a return path register coupled to the test data-in return pad; and
      the second multiplexer coupled to receive input returned data from the test data-in return pad, the data output, and the select signal to select output returned data to the test data-out pad.

9. The device according to claim 1, wherein length of each of an input daisy chain of the test data-input path and an output daisy chain of the test data-output path is programmable.

10. The device according to claim 1, wherein length of each of an input daisy chain of the test data-input path and an output daisy chain of the test data-output path is fixed.

11. A device, comprising:
   a die stack of two or more integrated circuit dies with associated test circuits corresponding to each level of the die stack, each of the test circuits has a set of pads;
   a test data-input path routed from:
      a test data-in pad through a test circuit to a test data-out pad of each of the test circuits; and
      the test data-out pad to the test data-in pad between consecutive levels of the test circuits;
   each of the set of pads including the test data-in pad and the test data-out pad respectively thereof;
   a test data-output path coupled to the test data-out pad of a level of the levels, wherein:
      the set of pads of each of the test circuits comprises a test data-in return pad and a test data-out return pad; and
      test data-out return pads of each of the test circuits are sequentially coupled to one another with intervening ones of test data-in return pads of the test circuits to provide a direct return output path.

12. The device according to claim 1, wherein each of the two or more integrated circuit dies are formed with the test circuits on corresponding semiconductor substrates.

13. A device, comprising:
a die stack region and a test stack region having common substrates respectively for corresponding levels of a stack;
the test stack region having a set of pads for each level of the levels of the stack;
a test data-input path in the test stack region routed from:
a test data-in pad through a test circuit to a test data-out pad of each of the levels; and
the test data-out pad to the test data-in pad between consecutive ones of the levels;
each of the set of pads including the test data-in pad and the test data-out pad respectively thereof;
a test data-output path coupled to the test data-out pad of one of the levels in the test stack region, wherein the set of pads comprises a test data-in return pad and a test data-out return pad; and
test data-out return pads of each of the levels are sequentially coupled to one another with intervening ones of test data-in return pads of each of the levels to provide a direct return output path.

14. The device according to claim 13, wherein:
the stack is a die stack including both the die stack region and the test stack region; and
an uppermost die in the die stack region is in a face-down orientation with each lower die in the die stack region in a face-up orientation.

15. A device, comprising:
a die stack region and a test stack region having common substrates respectively for corresponding levels of a stack;
the test stack region having a set of pads for each level of the levels of the stack;
a test data-input path in the test stack region routed from:
a test data-in pad through a test circuit to a test data-out pad of each of the levels; and
the test data-out pad to the test data-in pad between consecutive ones of the levels;
each of the set of pads including the test data-in pad and the test data-out pad respectively thereof;
a test data-output path coupled to the test data-out pad of one of the levels in the test stack region, wherein the set of pads further comprises a test data-in return pad and a test data-out return pad, and wherein the test data-output path routed from:
the test data-out pad through the test circuit to the test data-out return pad for each of the levels; and
the test data-out return pad connected to the test data-in return pad between consecutive ones of the levels.

16. A method, comprising:
bonding wafers to one another to provide die stacks each with a die stack region and a test stack region for levels thereof;
wherein each of the die stacks includes two or more integrated circuit dies; and
the bonding of the wafers including:
aligning a set of pads in the test stack region for each of the levels to one another for interconnection to provide a test data-input path and a test data-output path; and
the test data-input path and the test data-output path respectively extending through each of the levels to test all of the two or more integrated circuit dies of each corresponding die stack of the die stacks, the test data-input path routed from:
a test data-in pad of the set of pads through a test circuit to a test data-out pad of the set of pads for each of the levels; and
the test data-out pad to the test data-in pad between consecutive ones of the levels.

17. A method, comprising:
bonding wafers to one another to provide die stacks each with a die stack region and a test stack region for levels thereof;
wherein each of the die stacks includes two or more integrated circuit dies; and
the bonding of the wafers including:
aligning a set of pads in the test stack region for each of the levels to one another for interconnection to provide a test data-input path and a test data-output path; and
the test data-input path and the test data-output path respectively extending through each of the levels to test all of the two or more integrated circuit dies of each corresponding die stack of the die stacks, further comprising:
testing each of the two or more integrated circuit dies in the die stack of the die stacks via access through an uppermost one of the set of pads; and
wherein:
the die stack includes both the die stack region and the test stack region; and
the test data-input path routed from:
a test data-in pad of the set of pads through a test circuit to a test data-out pad of the set of pads for each of the levels; and
the test data-out pad to the test data-in pad between consecutive ones of the levels.

18. The device according to claim 1, wherein:
an uppermost die and lower dies of the die stack are respectively associated with the test circuits; and
the uppermost die of the die stack is in a face-down orientation with each lower die of the die stack in a face-up orientation.

* * * * *